(12) United States Patent  
Lee

(10) Patent No.: US 8,074,154 B2
(45) Date of Patent: Dec. 6, 2011

(54) METHODS AND APPARATUS FOR ENCODING AND DECODING CYCLIC CODES BY PROCESSING MULTIPLE SYMBOLS PER CYCLE

(76) Inventor: Joseph Schweiray Lee, San Diego, CA (US)

( * ) Notice: Subject to any disclaimer, the term of this patent is extended or adjusted under 35 U.S.C. 154(b) by 764 days.

(21) Appl. No.: 12/202,445

(22) Filed: Sep. 2, 2008

(65) Prior Publication Data

US 2009/0077449 A1   Mar. 19, 2009

Related U.S. Application Data

(60) Provisional application No. 60/993,359, filed on Sep. 13, 2007.

(51) Int. Cl.
*H03M 13/00* (2006.01)
(52) U.S. Cl. ...................................................... 714/785
(58) Field of Classification Search .......... 714/752–759, 714/780–786, 791, 793, 797–799
See application file for complete search history.

(56) References Cited

U.S. PATENT DOCUMENTS

| | | | | |
|---|---|---|---|---|
| 5,377,207 A * | 12/1994 | Perlman | | 714/784 |
| 6,640,327 B1 * | 10/2003 | Hallberg | | 714/785 |
| 7,475,330 B2 * | 1/2009 | Blankenship et al. | | 714/790 |
| 7,539,927 B2 * | 5/2009 | Lee et al. | | 714/784 |
| 2002/0035714 A1 * | 3/2002 | Kikuchi et al. | | 714/755 |

* cited by examiner

*Primary Examiner* — Nadeem Iqbal

(57) ABSTRACT

Provided are an encoder and a syndrome computer for cyclic codes which process M codeword symbols per cycle where M is greater than or equal to one, whereby the encoder and syndrome computer optionally further provide the configurability of a different M value for each cycle and/or the configurability of a different cyclic code for each codeword. Further provided is a hybrid device which provides the configurability of two modes of operation, whereby in one mode, the hybrid device functions as the encoder as provided above and, in the other mode, the hybrid device functions as the syndrome computer as provided above, with the majority of the components of the hybrid device being shared between the encoding function and the syndrome computing function.

17 Claims, 13 Drawing Sheets

(prior-art syndrome computer)

METHODS AND APPARATUS FOR ENCODING AND DECODING CYCLIC CODES BY PROCESSING MULTIPLE SYMBOLS PER CYCLE

PRIORITY APPLICATION

This application claims the benefit under 35 U.S.C. 119(e) of U.S. Provisional Application 60/993,359 (filed Sep. 13, 2007). The entire disclosure of this application is hereby incorporated by reference herein.

COPYRIGHT RIGHTS

A portion of the disclosure of this patent document contains material that is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

1. Field of the Invention

The present invention is related to the encoding and decoding of error correction codes in data communications and/or data storage systems, and in particular, to encoding and syndrome computation for cyclic codes.

2. Description of the Related Art

Error correction coding is often used in data communication systems and data storage systems to protect the integrity of the data transmitted over the communication channel or stored in the storage medium against data-corrupting conditions such as channel noise and storage medium defects, etc. Cyclic codes are a class of error correction codes which is often used due to their algebraic properties which lead to very practical implementations of the encoding and decoding algorithms.

FIG. 1 illustrates a generalized error correction coding scheme in a host system (101). In transmission to the channel/medium, the data generated by the data source (102) are encoded by the encoder (104). The encoded data are then sent to the physical interface (106) which manipulates the encoded data into a format suitable for transmission over the channel/medium (107). The physical interface (106) varies tremendously among different systems according to the specific characteristics of the channel/medium. In reading from the channel/medium, the physical interface (106) reads data potentially with errors from the channel/medium (107) and restores the encoded data format. The read encoded data is then sent to the decoder (105) where data in the original format from the data source (102) is recovered and sent to the data destination (103). The present invention focuses on the encoder (104) and decoder (105).

For an (n, k) cyclic code, encoding maps a sequence of k message symbols from the data source into another sequence of n symbols, commonly referred to as a "codeword", where n>k. Encoding methods are generally divided into two categories, namely the systematic and the non-systematic encoding. With systematic encoding, the message appears in the codeword itself, occupying the first k symbols of the codeword. With non-systematic encoding, the message does not necessarily appear in its corresponding codeword. The present invention focuses on systematic encoding.

As illustrated in FIG. 2, a widely known prior-art systematic cyclic code encoder is a feedback shift register (FSR) which calculates the parity and appends the parity after the message to form a codeword. The k message symbols are input (205), one symbol per cycle, while the "output-enable" signal (206) equals zero which causes the multiplexer (204) to pass each message symbol into the adder (202) and simultaneously to the output (203) as a codeword symbol. After all message symbols have been input, the n–k parity symbols are obtained and stored in the registers (201). The output-enable signal is then changed to one, which causes the multiplexer to pass the parity symbols to the output (203), one symbol per cycle. As a consequence, the systematically encoded codeword appears at output, one symbol per cycle.

Since the prior-art encoder processes one symbol per cycle, it is required that the clock rate of the FSR be the same as the rate at which symbols are input to the FSR. However, some host systems may have a symbol transfer rate higher than the achievable or desirable clock rate of the FSR. For example, in a system using a flash memory having an 8-bit interface as data storage where the host transfers data to the flash memory at a rate of one byte per 20 nanosecond, i.e. 50 mega bytes per second, or 400 mega bits per second, if the error correction code selected for this flash memory is a binary BCH code where the symbol size is one bit, then the FSR needs to be clocked at 400 MHz to accommodate the flash memory transfer rate. In many semiconductor designs, such a high clock rate is undesirable or unachievable.

Further, the symbol transfer rate of the host system may vary across time or different applications. For example, if the system in the above example can be configured to employ a flash memory having a 16-bit interface, then the data transfer rate is twice that of a flash memory having an 8-bit interface, even if the transfer cycle rate remains constant. If the prior-art encoder is used, then the clock rate of the FSR has to be changed according to the data transfer rate of the system. Since it adds to the system complexity to provide varying clock rates, it is not desirable to use the prior-art encoder in a system with varying data transfer rate.

Further, the error characteristics of the channel/medium may also vary across time or different applications, and thus may require different error correction codes to achieve different levels of data integrity. Since the prior-art encoder is fixed for a particular code, a system using the prior-art encoder is prohibited from employing a channel/medium which requires a different error correcting capability.

In light of the drawbacks of the prior-art encoder described above, it would be advantageous to devise an encoding apparatus which processes M symbols per cycle where M is greater than or equal to one, and/or further provides configurability for different values of M, and/or further provides configurability for different codes. The present invention provides such an encoding apparatus.

On the other hand, with an (n, k) cyclic code, a decoding operation first computes syndromes from the received codeword potentially containing errors. If all syndromes are zero, then the received codeword is a valid codeword and thus the decoding ends. If syndromes are not all zero, then the decoding operation proceeds to perform more steps to determine the locations and values of errors in the codeword. The present invention focuses on the first step of decoding, i.e. syndrome computation. Therefore, the terms decoding/decoder and syndrome computation/syndrome computer are used interchangeably in the present invention.

A widely known prior-art decoder based on the Homer's Algorithm is illustrated in FIG. 3. This decoder computes 2T syndromes by evaluating the received codeword polynomial r(X) at the 2T roots (305) of the generator polynomial of the code, respectively, where T is the maximum number of symbol errors correctable by the cyclic code. The syndromes [$S_0, \ldots, S_{2T-1}$] are obtained and stored in the registers (303) after all received codeword symbols have been input via (301), one symbol per cycle. Since this decoder processes one symbol per cycle, it is to be clocked at the symbol transfer rate of the system which may be higher than the achievable or desirable clock rate of the decoder.

As a counterpart of the prior-art encoder, this prior-art decoder shares the same drawbacks of the prior-art encoder. Therefore, it would be advantageous to devise a decoder which processes M symbols per cycle, and/or further provides configurability for different values of M, and/or further provides configurability for different generator polynomials.

Since both the encoder and the decoder contain a significant amount of logic, such as Galois Field multipliers and Galois Field adders, it would be advantageous to merge the encoder and the decoder into a hybrid apparatus with the majority of the logic in the apparatus shared by the two functions.

SUMMARY OF THE INVENTION

In the encoding aspect of the present invention, an encoding apparatus for (n, k) cyclic codes, hereinafter referred to as the "Encoder", is provided which processes M message symbols per cycle where $M \geq 1$. The Encoder comprises a vector table, a register unit and an arithmetic unit. In each cycle of the encoding operation, the host system inputs M message symbols to the Encoder while the Encoder treats all previously and currently input message symbols as the message of a temporary codeword and computes the parity for this temporary codeword. The temporary parity of each cycle is computed by the arithmetic unit using the vector table output, the currently input M message symbols and the content of the register unit as input, and is latched into the register unit at the end of the cycle. After all message symbols of the final codeword have been input, the register unit contains the parity of the final codeword, which is then read out of the register unit by the host.

In the decoding aspect of the present invention, a syndrome computer for (n, k) cyclic codes, hereinafter referred to as the "Decoder", is provided which processes M symbols of a received codeword per cycle. The Decoder comprises a vector table, a register unit and an arithmetic unit. In each cycle of the decoding operation, the host system inputs M symbols of the received codeword to the Decoder while the Decoder treats all previously and currently input symbols as a temporary received codeword and computes the syndromes for this codeword. The temporary syndromes of each cycle are computed by the arithmetic unit using the vector table output, the currently input M message symbols and the content of the register unit as input, and are latched into the register unit at the end of the cycle. After all symbols of the final received codeword have been input, the register unit contains the syndromes of the final received codeword, which are then read out of the register unit by the host.

The present invention further provides a hybrid Encoder and Decoder apparatus hereinafter referred to as the "Hybrid Device" which may be configured to function as either the Encoder or the Decoder, with the majority of the structure shared by the two merged functions.

The first embodiment provides an Encoder and a Decoder which process M message symbols per cycle, whereby the Encoder outputs all parity symbols on its output signal after all message symbols of a codeword have been input to the Encoder.

The second embodiment provides an Encoder which outputs M parity symbols per cycle after all message symbols of a codeword have been input to the Encoder.

In the third exemplary embodiment, the Encoder and the Decoder may further be configured to operate with a different M value in each cycle.

In the fourth exemplary embodiment, the Encoder and the Decoder may further be configured to operate under a different cyclic code for each codeword.

The fifth embodiment provides an exemplary Hybrid Device. Minor modifications can be made such that the Hybrid Device can be configured for different M values per cycle and/or different cyclic codes per codeword. These modifications are not presented in this embodiment since they have been presented in previous embodiments of both the Encoder and the Decoder, and thus it is obvious to those skilled in the art to incorporate such modifications into the Hybrid Device.

DETAILED DESCRIPTION OF PREFERRED EMBODIMENTS

In the present invention, a "cycle" refers to a clock cycle or an iteration of operation triggered by an external signal. The terms "cycle" and "clock cycle" are used interchangeably. A "symbol" refers to a data unit of a fixed number of bits. Symbols of m bits can be represented by elements of a Galois Field (or GF) of order $2^m$. Once a particular GF is selected to represent the symbols, arithmetic operations between two symbols are defined by the GF. In the present invention, arithmetic operators such adders and multipliers perform arithmetic operations as defined by the GF. A "vector" refers to a collection of symbols which may be either stored in a register and/or transferred over a signal.

A sequence of symbols may be represented by a polynomial. The present invention uses the convention that the symbol with the highest index in the sequence corresponds to the highest-order coefficient of the polynomial, and is the first symbol to be transmitted over the channel/medium, and therefore is also the first symbol to enter the Encoder and the Decoder. In the text below, the terms "coefficient" and "symbol" are used interchangeably.

The first exemplary embodiment provides an Encoder and a Decoder which process M message symbols per cycle.

Figure 1:
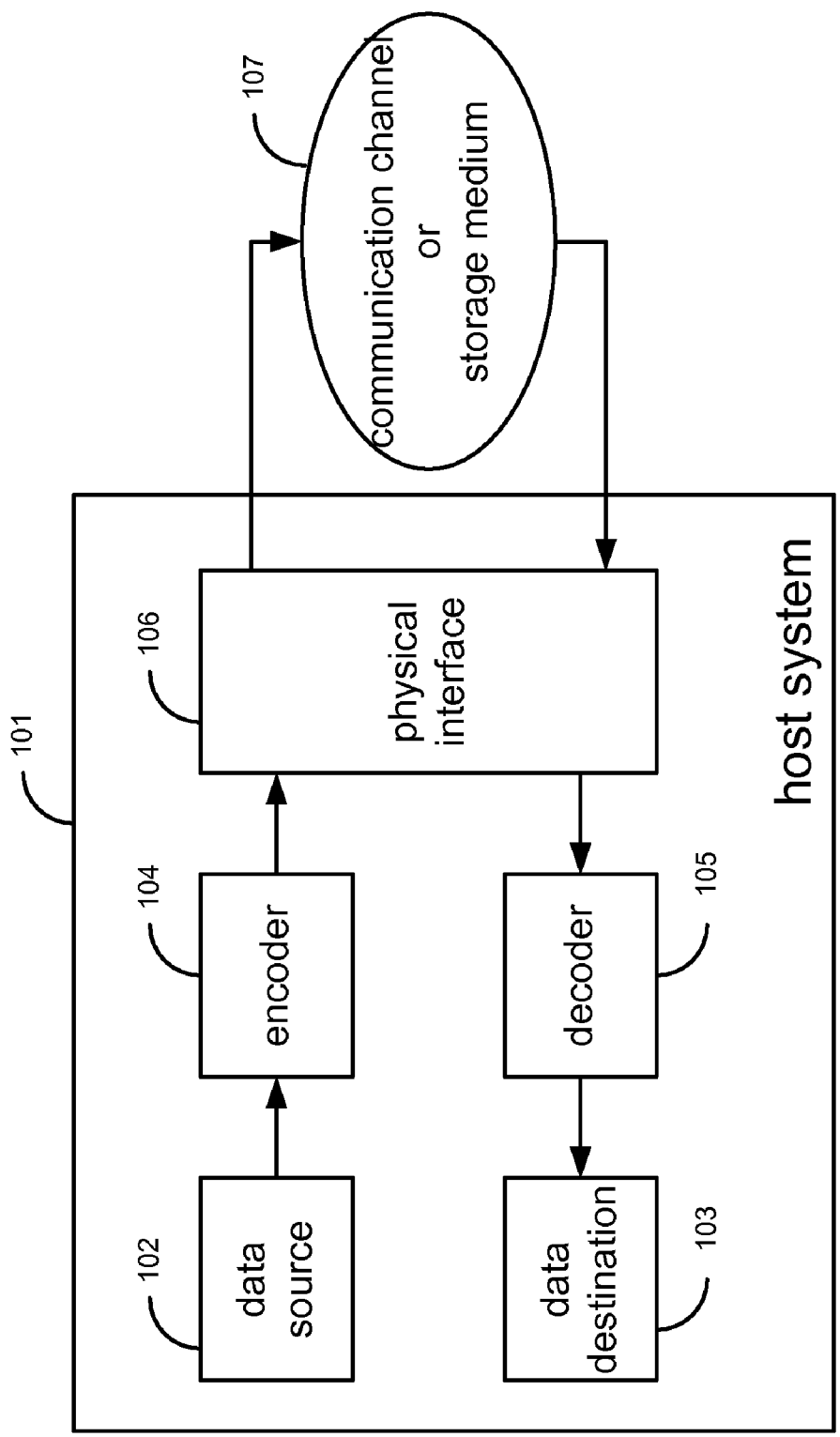
FIG. 1 illustrates a generalized overview of an error correction coding scheme in a host system.
Figure 2:
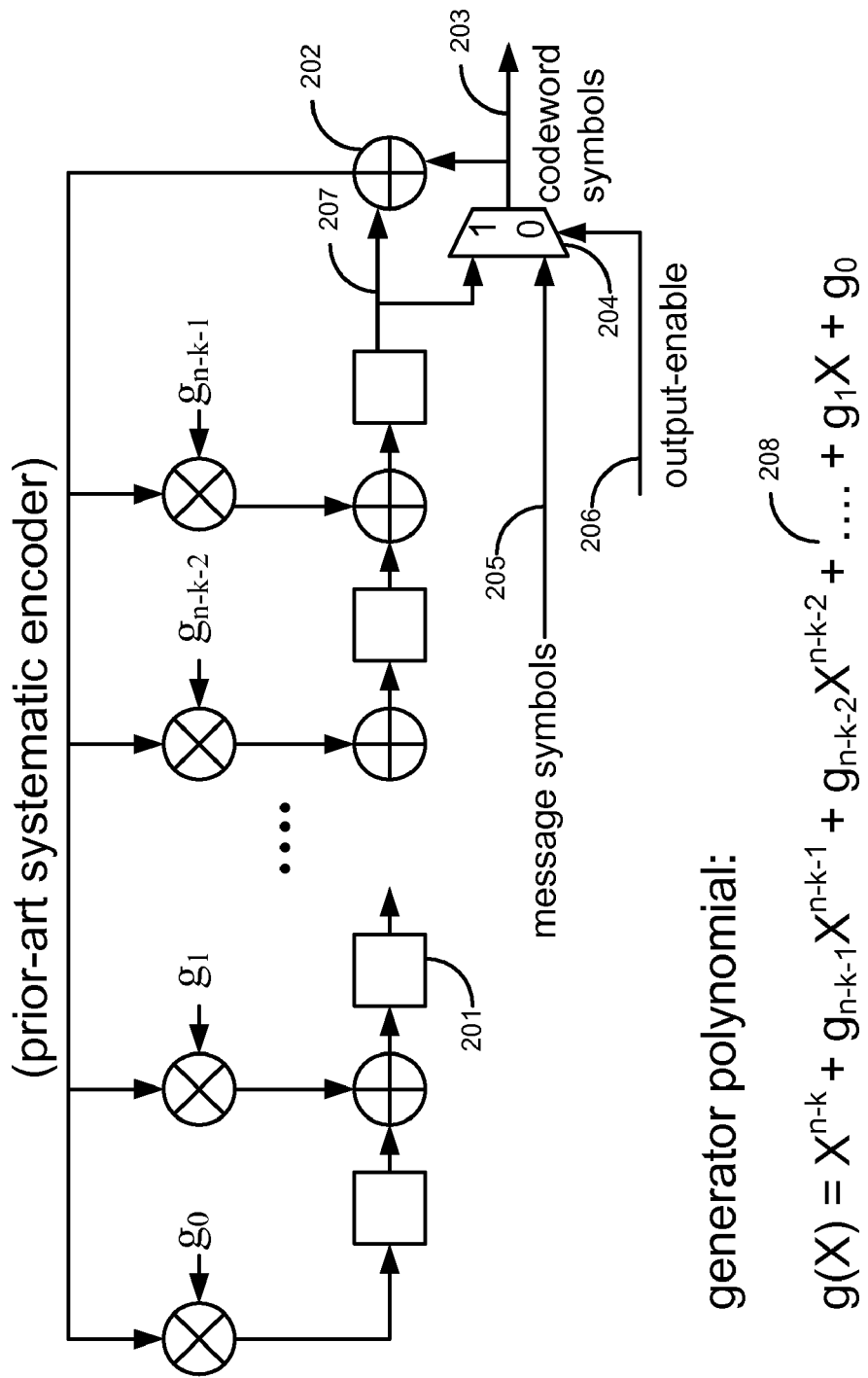
FIG. 2 illustrates a prior-art cyclic code encoder.
Figure 3:
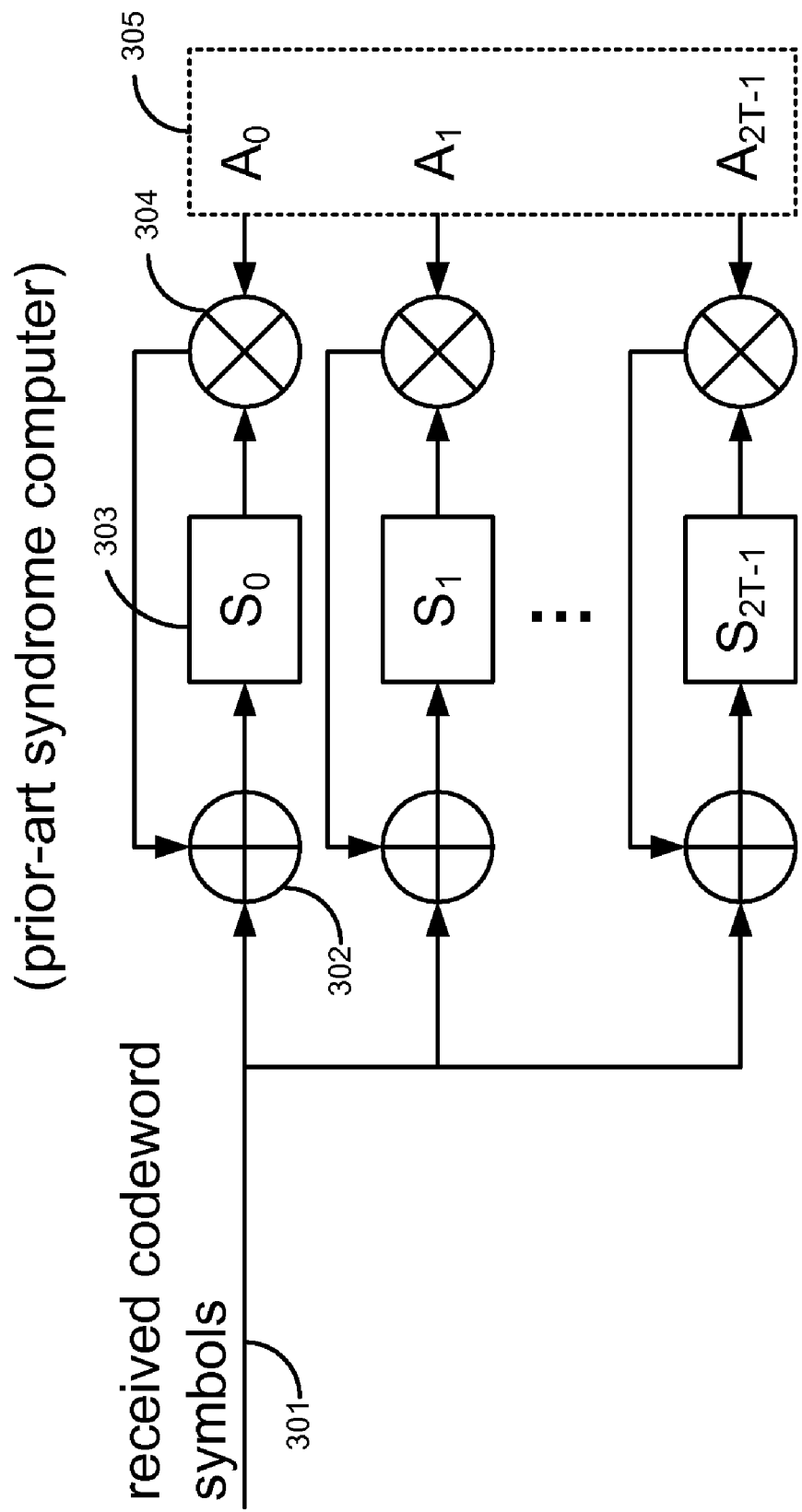
FIG. 3 illustrates a prior-art cyclic code syndrome computer.
Figure 4:
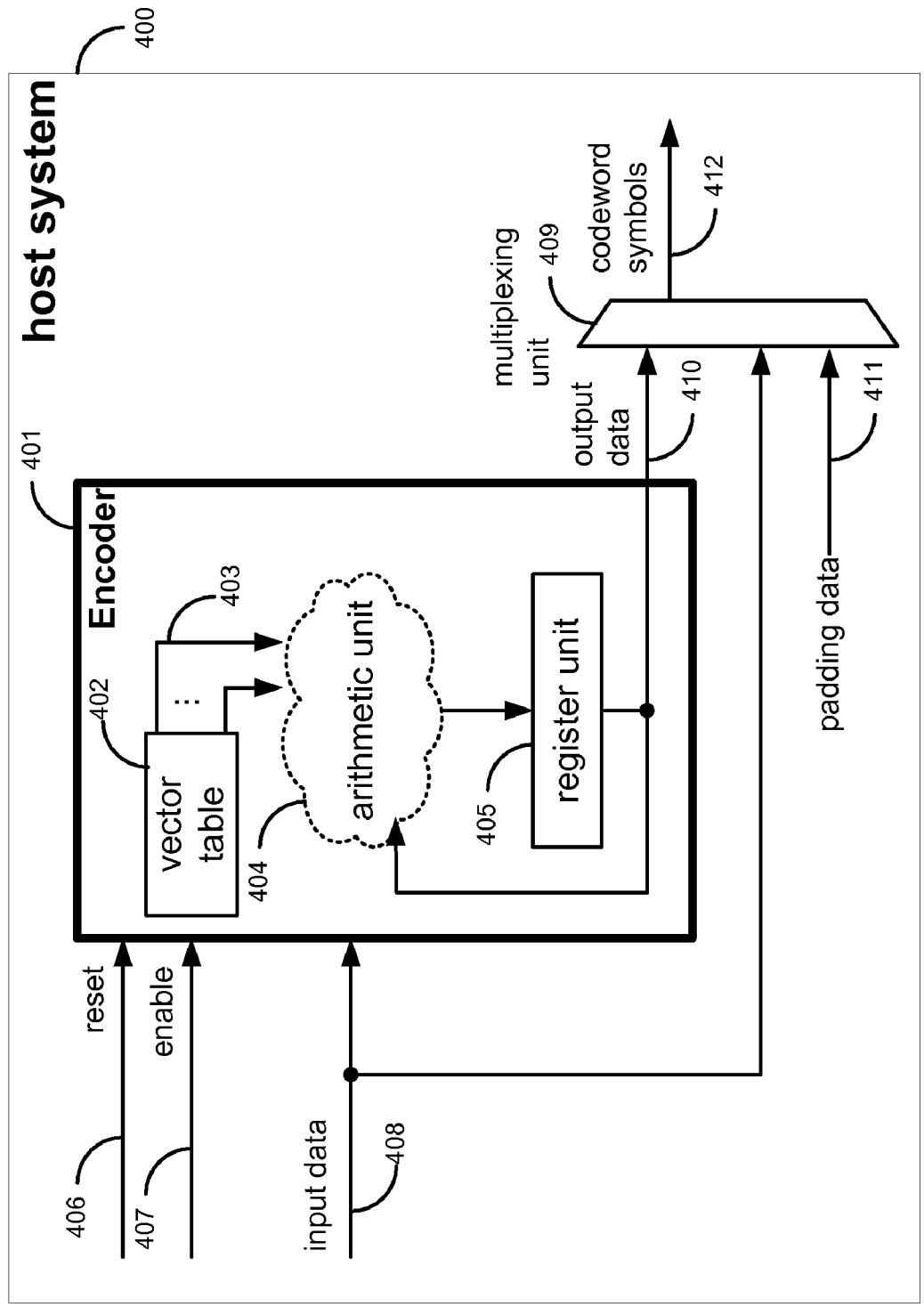
FIG. 4 illustrates a generalized overview of the Encoder of the present invention.

The Encoder of the first embodiment is described as follows. As illustrated in FIG. 4, the Encoder comprises a vector table (402), a register unit (405) and an arithmetic unit (404). The vector table outputs M vectors (403) each of which comprises the n–k coefficients of a pre-calculated remainder polynomial obtained from dividing a corresponding Identity Polynomial (defined below) by the generator polynomial g(X) of the cyclic code. The register unit is capable of storing n–k symbols. The Encoder further comprises an input data signal (408) via which the host inputs M message symbols per cycle to the Encoder, an output data signal (410) outputting the content of the register unit as the output of the Encoder, a reset signal (406) which clears the register unit to zero when asserted, and optionally an input enable signal (407) which enables the register unit to latch the output of the arithmetic unit at the end of a cycle when asserted. Before the encoding operation begins, the reset signal is asserted to clear the register unit to zero. Once encoding begins, the enable signal is asserted to enable the register unit. In each cycle, the host inputs M message symbols of a codeword to the input data signal while the arithmetic unit computes a linear combination of vectors output by the vector table and a vector formed by the lower n–k–M symbols of the register unit shifted higher by M symbols, whereby the coefficients of the linear combination are symbols of the vector sum of M input message symbols and M upper symbols of the register unit, and loads the sum of the linear combination into the register unit at the end of the cycle. After all message symbols have entered the Encoder, the register unit contains the n–k parity symbols which are output via the output data signal. The enable signal is then unasserted to disable the register unit while the host reads the parity symbols via the output data signal.

The function of the arithmetic unit is described in more details as follows. An Identity Polynomial is defined as a polynomial having only one nonzero term with a coefficient having the value of one. For example, an Identity Polynomial of degree 6 is $X^6$. An Identity Polynomial of degree 'i' is denoted as $I_i(X)$. An Identity Remainder Polynomial, denoted as $R_i(X)$, is defined as the remainder polynomial resulting from dividing the corresponding Identity Polynomial $I_i(X)$ by the generator polynomial g(X) of the (n, k) cyclic code. The n–k coefficients of an Identity Remainder Polynomial $R_i(X)$ may be viewed as a vector of n–k symbols referred to as an Identity Remainder Vector, or simply an IR Vector.

A message of k symbols $[D_{k-1}, D_{k-2}, \ldots, D_1, D_0]$ can be represented by a polynomial $D(X) = D_{k-1}X^{k-1} + D_{k-2}X^{k-2} + \ldots + D_1X + D_0$. Similarly, the n–k parity symbols and the n codeword symbols can be represented by P(X) of degree n–k–1 and C(X) of degree n–1, respectively. To encode a systematic codeword, the parity polynomial P(X) is computed and attached to the end of the message polynomial D(X) to form the codeword. P(X) is the remainder polynomial resulting from dividing $X^{n-k}D(X)$ by the generator polynomial g(X) of the (n, k) cyclic code, i.e. $P(X) = X^{n-k}D(X)$ modulo g(X). Note that multiplying D(X) by $X^{n-k}$ is equivalent to shifting D(X) higher by n–k positions. Then a codeword polynomial C(X) is obtained by combining $X^{n-k}D(X)$ and P(X), in other words, $C(X) = X^{n-k}D(X) + P(X)$.

In each cycle of the encoding operation, the Encoder treats all previously and currently input message symbols as the message of a temporary codeword and computes the parity for this codeword, and then loads the parity into the register unit at the end of the cycle. For example, in cycle 0, the first set of M message symbols $[D_{k-1}, D_{k-2}, \ldots, D_{k-M}]$ represented by $D_0(X)$ is input. The Encoder treats $D_0(X)$ as the message of a temporary codeword and computes the parity $P_0(X)$ for this codeword, where $P_0(X) = X^{n-k}D_0(X)$ modulo g(X).

In cycle 1, another set of M message symbols $[D_{k-M-1}, D_{k-M-2}, \ldots, D_{k-2M}]$ represented by $D_1(X)$ is input. At this point, the 2M message symbols already input thus far can be represented as $[X^M D_0(X) + D_1(X)]$ which the Encoder treats as the message of a temporary codeword and computes the parity $P_1(X)$ for this codeword, where $P_1(X) = X^{n-k}[X^M D_0(X) + D_1(X)]$ modulo g(X).

More generally, in cycle 'j', the arithmetic unit computes the temporary parity $P_j(X)$, which is loaded into the register unit at the end of cycle 'j'. $P_j(X)$ can be expressed as:

$$P_j(X) = X^{n-k}[X^{jM}D_0(X) + X^{(j-1)M}D_1(X) + \ldots + X^M D_{j-1}(X) + D_j(X)] \text{ modulo } g(X) \quad \text{(eq. 1)}$$

$$= \{X^{n-k}[X^{jM}D_0(X) + X^{(j-1)M}D_1(X) + \ldots + X^M D_{j-1}(X)] \text{ modulo } g(X)\} + $$

$$[X^{n-k}D_j(X) \text{ modulo } g(X)].$$

The first term of (eq. 1) is now further derived. In cycle j, the content of the register unit is the output of the arithmetic unit of the previous cycle (j–1) and can be expressed as:

$$P_{j-1}(X) = X^{n-k}[X^{(j-1)M}D_0(X) + X^{(j-2)M}D_1(X) + \ldots + D_{j-1}(X)] \text{ modulo } g(X).$$

The above equation can be rewritten as:

$$X^{n-k}[X^{(j-1)M}D_0(X) + X^{(j-2)M}D_1(X) + \ldots + D_{j-1}(X)] = Q(X)g(X) + P_{j-1}(X).$$

Multiplying both sides of the above equation by $X^M$, we have $$X^{n-k}[X^{jM}D_0(X) + X^{(j-1)M}D_1(X) + \ldots + X^M D_{j-1}(X)] = X^M Q(X)g(X) + X^M P_{j-1}(X).$$

Therefore, the first term of (eq. 1) can now be expressed as $$X^{n-k}[X^{jM}D_0(X) + X^{(j-1)M}D_1(X) + \ldots + X^M D_{j-1}(X)] \text{ modulo } \quad \text{(eq. 2)}$$

$$g(X) = [X^M Q(X)g(X) + X^M P_{j-1}(X)] \text{ modulo } g(X) = $$

$$X^M P_{j-1}(X) \text{ modulo } g(X).$$

Now, (eq. 1) can be rewritten as:

$$P_j(X) = [X^M P_{j-1}(X) \text{ modulo } g(X)] + \quad \text{(eq. 3)}$$

$$[X^{n-k}D_j(X) \text{ modulo } g(X)]$$

$$= [X^M P_{j-1}(X) + X^{n-k}D_j(X)] \text{ modulo } g(X).$$

The dividend in (eq. 3), $[X^M P_{j-1}(X) + X^{n-k} D_j(X)]$, can be expanded as $$X^M P_{j-1}(X) + X^{n-k}D_j(X) = [P_{j-1,n-k-1}X^{n+M-1} + P_{j-1,n-k-2}X^{n-k+M-2} + \ldots + P_{j-1,1}X^{M+1} + P_{j-1,0}X^M] + [D_{k-jM-1}X^{n-k+M-1} + D_{k-jM-2}X^{n-k+M-2} + \ldots + D_{k-jM-M}X^{n-k}].$$

Collecting terms of degrees higher than or equal to n−k into one group, and terms of degrees lower than n−k into another group, the above equation can be rewritten as $$X^M P_{j-1}(X) + X^{n-k} D_j(X) = [(D_{k-jM-1} + P_{j-1,n-k-1}) X^{n-k+M-1} + \ldots + (D_{k-jM-M} + P_{j-1,n-k-M}) X^{n-k}] +$$
$$[P_{j-1,n-k-M-1} X^{n-k-1} + \ldots + P_{j-1,0} X^M]$$

Finally, using the Identity Remainder Polynomials, (eq. 3) can be rewritten as:

$$P_j(X) = [X^M P_{j-1}(X) + X^{n-k} D_j(X)] \text{ modulo } g(X) = \quad \text{(eq. 4)}$$
$$[(D_{k-jM-1} + P_{j-1,n-k-1}) R_{n-k+M-1}(X) +$$
$$\ldots + (D_{k-jM-M} + P_{j-1,n-k-M}) R_{n-k}(X)] +$$
$$[P_{j-1,n-k-M-1} X^{n-k-1} + \ldots + P_{j-1,0} X^M]$$

Figure 5:
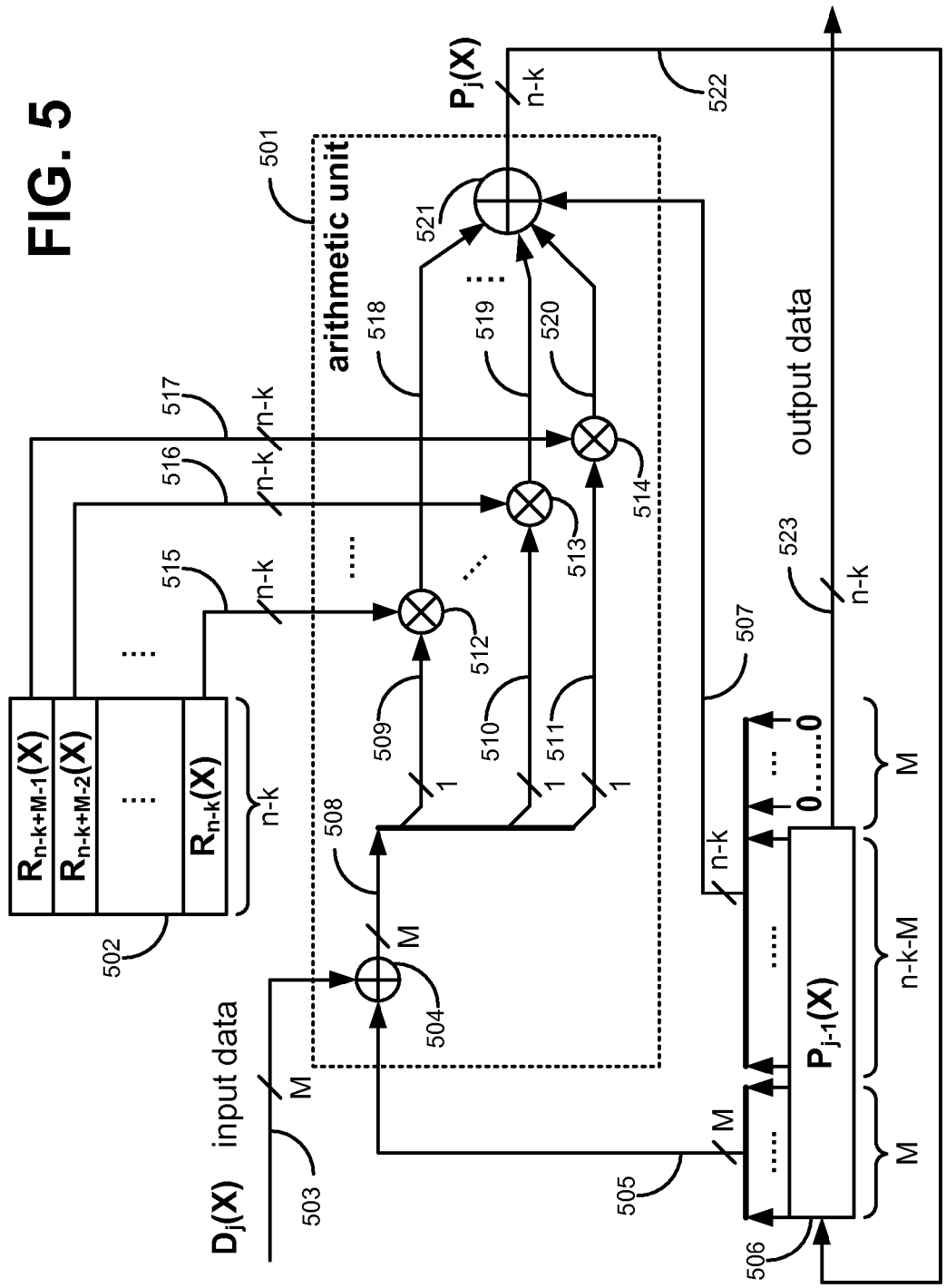
FIG. 5 illustrates an exemplary Encoder of the first embodiment.

FIG. 5 illustrates a more detailed view of the Encoder of the first embodiment. The vector table (502) outputs M IR Vectors $R_{n-k}(X), \ldots, R_{n-k+M-1}(X)$ (515 to 517). The arithmetic unit (501) comprises a two-input adder (504), an (M+1)-input adder (521) and M scalar-vector multipliers (512 to 514), and computes $P_j(X)$ (522) in cycle j according to the equation (eq. 4), wherein $P_j(X)$ is loaded into the register unit (506) at the end of cycle j.

The M input message symbols $[D_{k-jM-1}, \ldots, D_{k-jM-M}]$ (503) form the "Symbol Vector". The upper M symbols of the register unit, i.e. $[P_{j-1,n-k-1}, \ldots, P_{j-1,n-k-M}]$, form the "Register Coefficient Vector" (505). The two-input adder (504) performs an addition of the Symbol Vector and the Register Coefficient Vector and outputs the M-symbol vector named the "Adder Coefficient Vector" (508). Each scalar-vector multiplier (512 to 514), hereinafter referred to as simply "scalar multiplier", multiplies a symbol (509 to 511) of the Adder Coefficient Vector with a corresponding IR Vector. Therefore, each scalar multiplier outputs a term of degree greater than or equal to n−k in (eq. 4). Meanwhile, A vector of n−k symbols, named the "Register Feedback Vector" (507), is formed by the lower n−k−M symbols $[P_{j-1,n-k-M-1}, \ldots, P_{j-1,0}]$ in the register unit (506) shifted higher by M symbols. In other words, the Register Feedback Vector is $[P_{j-1,n-k-M-1}, \ldots, P_{j-1,0}, 0, \ldots, 0]$. Note that the Register Feedback Vector is a zero vector if M≧n−k. The Register Feedback Vector provides the terms of degrees lower than n−k in (eq. 4). Finally, the (M+1)-input adder (521) performs an addition of the M vectors (518 to 520) output by the scalar multipliers and the Register Feedback Vector and outputs $P_j(X)$ (522), which is loaded into the register unit at the end of cycle j.

Note that the drawings of the present invention use the convention described as follows. The polynomial $P_{j-1}(X)$ is stored in the register unit (506) in such a manner that the highest-order coefficient $P_{j-1,n-k-1}$ is stored in the left-most position, and the lowest-order coefficient $P_{j-1,0}$ in the right-most position. Each symbol of the Adder Coefficient Vector (508) is represented by a signal in such a manner that the highest-order symbol is represented by the bottom signal (511), and the lowest-order symbol by the top signal (509).

FIG. 4 shows that the host assembles the encoded codeword by properly selecting M symbols per cycle from the input data signal (408) and the output data signal (410) by using a multiplexing unit (409). In the cycles when the host transfers the message symbols of the codeword, the host keeps the enable signal (407) asserted while the multiplexing unit (409) selects the M message symbols (408) as its output (412). In the cycles when the host transfers the parity of the codeword, the host keeps the enable signal unasserted while the multiplexing unit selects M parity symbols from the output data signal (410) in each cycle, starting from the highest M symbols of the output data signal, until all n−k parity symbols have been output. As a consequence, a systematically encoded codeword appears at output (412) at a rate of M symbols per cycle. If M is not a factor of the length of the message and thus the input data signal (408) contains fewer than M message symbols in the last cycle of transferring the message, then padding data (411) may be used by the multiplexing unit to form the M symbols of the last cycle of transferring the message. Similarly, if M is not a factor of the length of the parity, padding data may be used to form the M symbols of the last cycle of transferring the parity.

In place of the vector table (502), the IR Vectors may alternatively be provided by the scalar multipliers (512 to 514). In this case, the scalar multipliers are "constant multipliers", whereby each constant multiplier multiplies the input symbol (509 to 511) with a vector fixed to be the corresponding IR Vector.

The Decoder of the first embodiment is described as follows. Hereinafter, the term "received codeword" refers to an (n, k) cyclic code codeword which is read from the channel/medium of the host system and which may have been corrupted by errors. The term "received symbols" refers to symbols of the received codeword.

Let the n symbols of the received codeword $[r_{n-1}, r_{n-2}, \ldots, r_1, r_0]$ be represented by the polynomial $r(X) = r_{n-1} X^{n-1} + r_{n-2} X^{n-2} + \ldots + r_1 X + r_0$, and let the 2T roots of the generator polynomial $g(X)$ be $[A_0, A_1, \ldots, A_{2T-1}]$, where T is the maximum number of symbol errors correctable by the cyclic code. The Decoder computes the 2T syndromes $[S_0, S_1, \ldots, S_{2T-1}]$ by evaluating $r(X)$ at the 2T roots of $g(X)$. Thus, using 'i' to index each syndrome, the 2T syndromes are $S_i = [r(X)|X=A_i]$, $i=0, \ldots, 2T-1$.

In each cycle of the decoding operation, the Decoder treats all previously and currently input symbols as a temporary received codeword and computes syndromes for this codeword. In cycle 0, the first set of M received symbols $[r_{n-1}, r_{n-2}, \ldots, r_{n-M}]$ represented by $r_0(X)$ is input to the Decoder. The Decoder treats $r_0(X)$ as the temporary received codeword and computes the syndromes for this codeword as follows:

$$S_{i,0} = [r_0(X)|X=A_i], i=0, 1, \ldots, 2T-1.$$

In cycle 1, the second set of M received symbols $[r_{n-M-1}, r_{n-M-2}, \ldots, r_{n-2M}]$ represented by $r_1(X)$ is input to the Decoder. At this point, the 2M received symbols already input thus far can be represented as $[X^M r_0(X) + r_1(X)]$, which the Decoder now treats as a temporary received codeword and computes the syndromes for this codeword as follows:

$$S_{i,1} = [X^M r_0(X) + r_1(X) | X = A_i]$$
$$= (A_i)^M [r_0(X) | X = A_i] + [r_1(X) | X = A_i]$$
$$= (A_i)^M S_{i,0} + [r_1(X) | X = A_i], \quad i = 0, 1, \ldots, 2T-1.$$

More generally, in cycle 'j', the i-th syndrome $S_{i,j}$ is a function of the i-th syndrome computed in the previous cycle (cycle j−1) $S_{i,j-1}$ and the currently input symbols $r_j(X)$, and can be expressed as:

$$S_{i,j} = (A_i)^M S_{i,j-1} + [r_j(X)|X=A_i], i=0,1,\ldots,2T-1. \quad \text{(eq. 5)}$$

Figure 6:
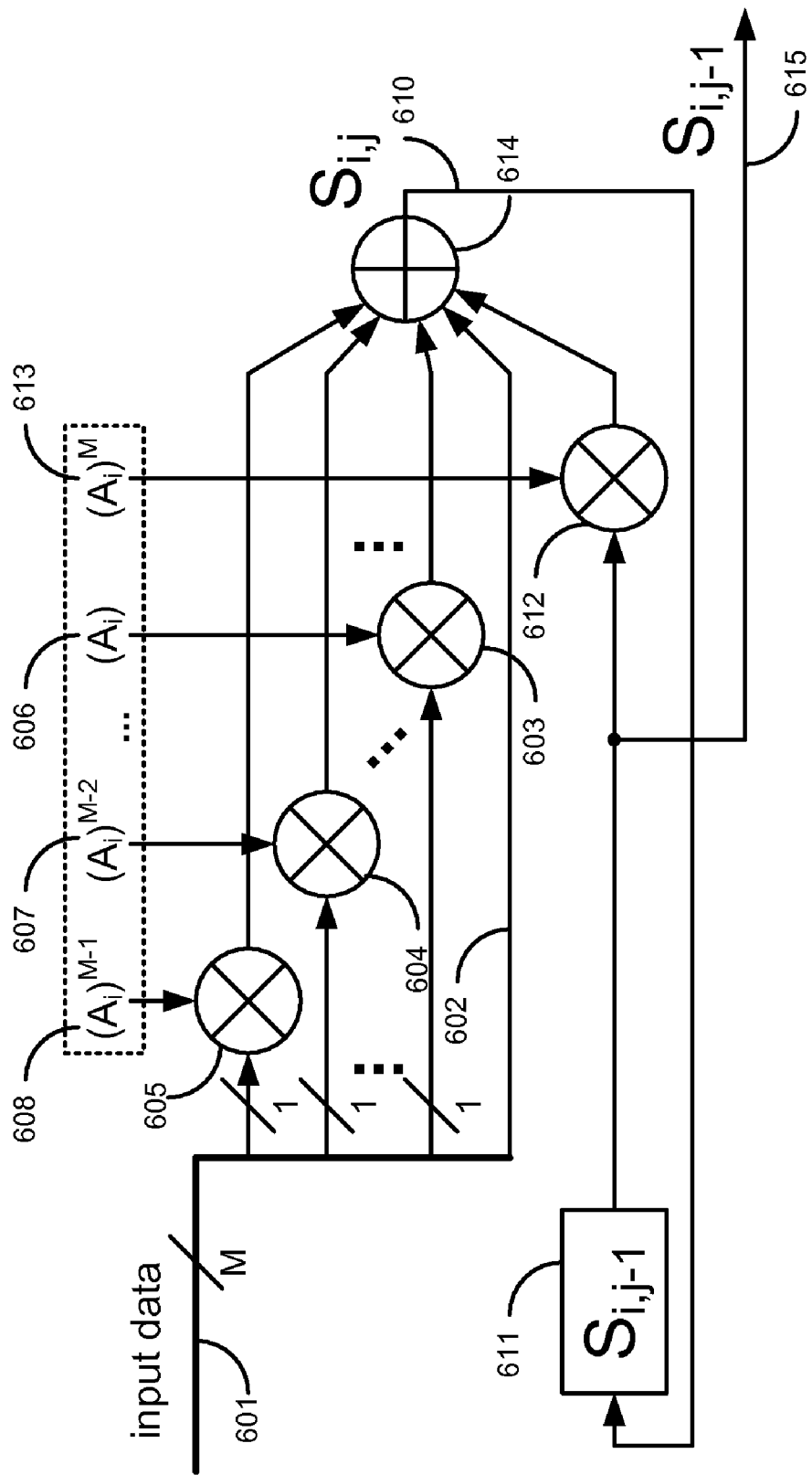
FIG. 6 illustrates a syndrome computing apparatus which computes one syndrome.

FIG. 6 illustrates an exemplary apparatus which computes the i-th syndrome $S_{i,j}$ according to (eq. 5). In cycle j of the decoding operation, the host inputs M received symbols via the input data signal (601) while the scalar multipliers (603,

604, 605, 612) and the adder (614) computes $S_{i,j}$ (610) which is latched into the register (611) at the end of cycle j. After all received symbols have been input, the register contains the i-th syndrome $S_i$ of the received codeword.

Figure 7:
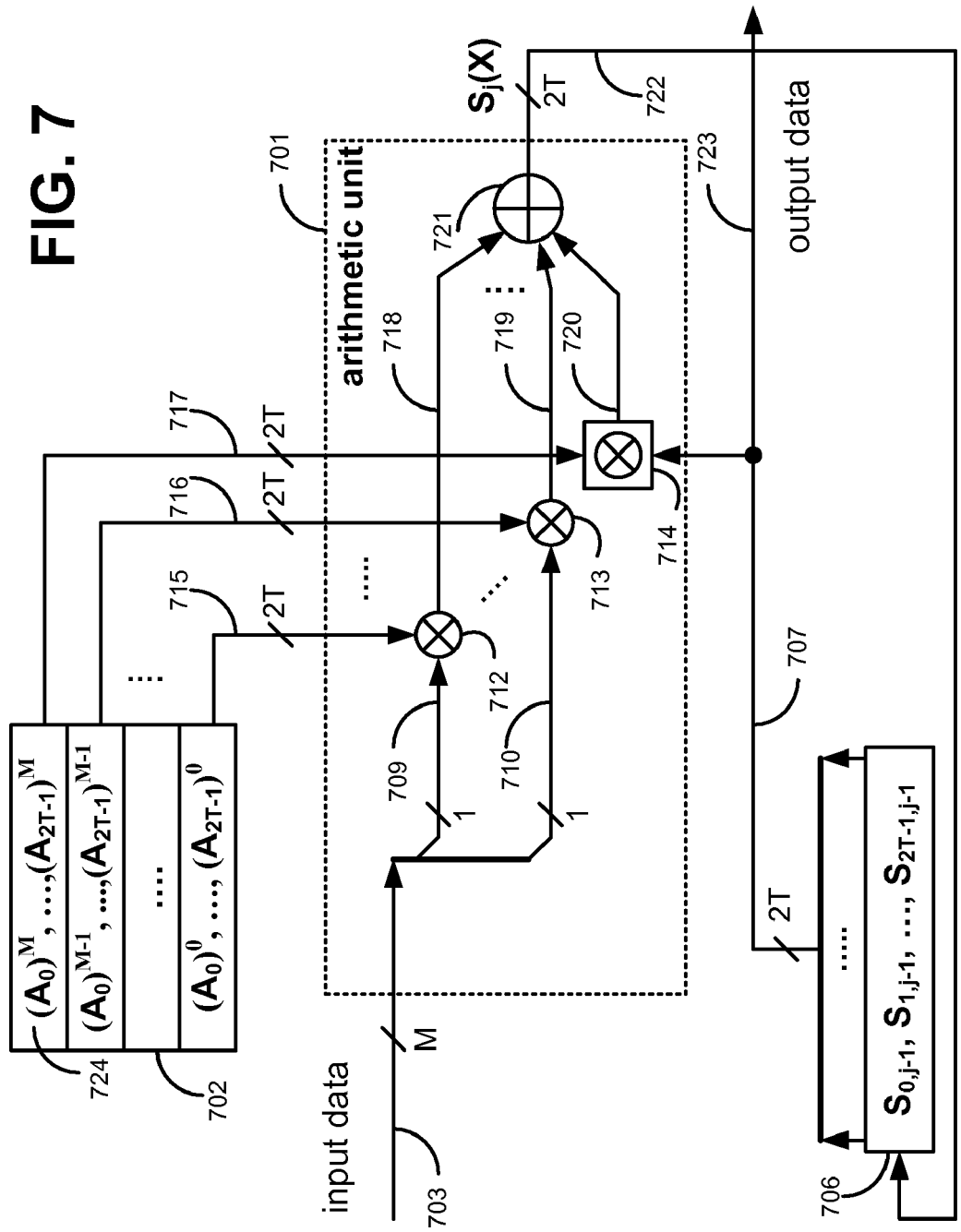
FIG. 7 illustrates an exemplary Decoder of the first embodiment.

FIG. 7 illustrates an exemplary Decoder, which is an expansion of the apparatus of FIG. 6 such that the Decoder computes 2T syndromes simultaneously. The Decoder comprises a vector table (702) which outputs M+1 vectors (715 to 717), hereinafter referred to as the "Root Vectors" and indexed from 0 to M, whereby each Root Vector contains the roots of g(X) raised to a power equal to the index of the entry. For example, the Root Vector of index 'q' contains 2T elements $[(A_0)^q, (A_1)^q, \ldots, (A_{2T-1})^q]$, whereby each element is the power 'q' of a distinct root of g(X). The Decoder further comprises an arithmetic unit (701) which computes the temporary syndromes according to (eq. 5) in each cycle, and a register unit (706) which latches the temporary syndromes (722) output by the arithmetic unit in each cycle. The Decoder further comprises an input data signal (703) via which the host inputs M received symbols per cycle, and an output data signal (723) which outputs the content of the register unit as the output of the Decoder.

In cycle j, the register unit contains syndromes computed in cycle j−1 hereinafter referred to as the "Register Feedback Vector" (707). The arithmetic unit comprises M scalar multipliers (712, 713), a vector-vector multiplier (714) and an (M+1)-input adder (721). Each of the M scalar multipliers multiplies a received symbol (709, 710) with a corresponding Root Vector (715, 716) and outputs another vector of 2T elements (718, 719). The vector-vector multiplier (714), hereinafter referred to as simply the "vector multiplier", performs an element-wise multiplication of the Register Feedback Vector (707) and the Root Vector of index M (717). In other words, the vector multiplier outputs a vector of 2T elements, wherein each element is the product of the multiplication of an element of the Register Feedback Vector and a corresponding element of the Root Vector of index M. Note that the vector multiplier does not perform the inner product of two vectors. The M+1 vectors (718 to 720) output by the scalar multipliers and the vector multiplier are vector-summed by the adder (721) which outputs a vector (722) of 2T elements whereby each element is a temporary syndrome of cycle j. The output vector of the adder (721) is latched into the register unit at the end of cycle j. After all received symbols have been input, the register unit contains the 2T syndromes of the received codeword, which are output via the output data signal (723).

Note that the size of the codeword symbols may be different from that of the roots of g(X). Let the codeword symbols be m bits and represented by $GF(2^m)$, and let the g(X) roots be g bits and represented by $GF(2^g)$, where $GF(2^g)$ is an extension field of $GF(2^m)$ and thus all elements of $GF(2^m)$ are also elements of $GF(2^g)$. Further, the syndromes and the power of a g(X) root are also elements of $GF(2^g)$. In the Decoder, each scalar multiplier performs the multiplication defined by $GF(2^g)$, whereby the received symbol is represented by an element of $GF(2^g)$ as an input to the scalar multiplier.

In the case of binary cyclic codes, where each codeword symbol is 1 bit wide, only T, instead of 2T, syndromes need to be calculated in the decoding operation. This is because the generator polynomial g(X) of a binary cyclic code is over GF(2), and thus T of the roots of G(X) are conjugates of the other T roots. Thus, each Root Vector contains T elements while the register unit has the capacity of storing T syndromes.

Several additional exemplary embodiments will now be described, and the description will focus on the elements that differ from the embodiments described previously. Elements of the additional embodiments that are the same as previous embodiments are not repeatedly described.

The second embodiment provides an Encoder which is an expansion of the Encoder of the first embodiment and is now described. In the second embodiment, the Encoder performs the same encoding function as that of the first embodiment in the cycles when the host inputs the message symbols. However, after the parity is computed and stored in the register unit, the IR Vectors are forced to zero vectors. From this point on, the output data signal outputs M parity symbols in each cycle until all n−k parity symbols have been output, at which point the register unit contains only zero symbols.

Figure 8:
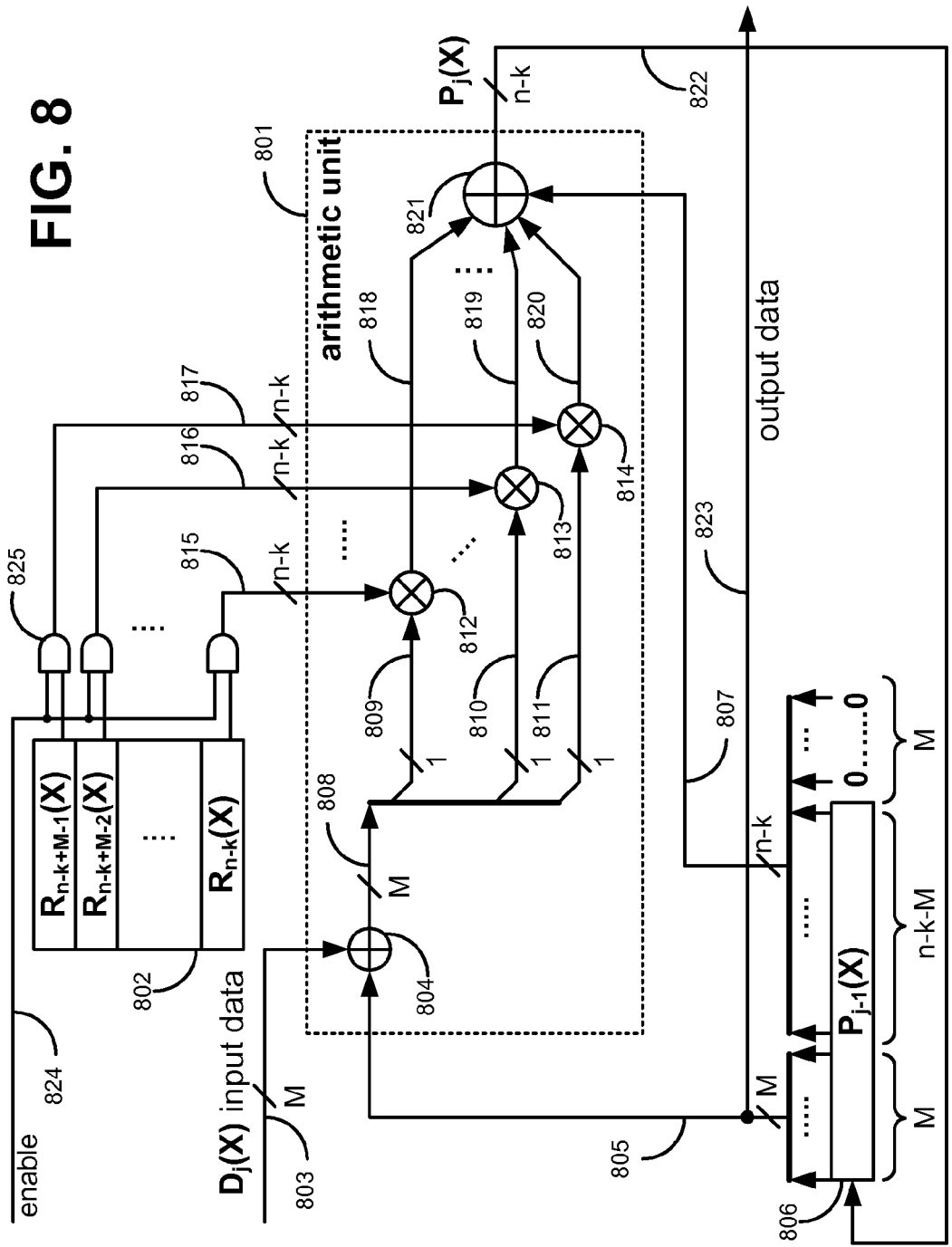
FIG. 8 illustrates an exemplary Encoder of the second embodiment.

As illustrated in FIG. 8, the vector table (802) outputs are gated by the enable signal (824) with, as an example, AND gates (825) which conditionally pass the IR Vectors only when the enable signal is asserted. The register unit (806) is enabled regardless of the enable signal. The output data signal (823) outputs the highest M symbols of the register unit. Before and during the encoding operation of a codeword, the host operates the Encoder in the same manner as the first embodiment. After the parity is computed and stored in the register unit, the enable signal is unasserted. With the enable signal unasserted, the AND gates output zero vectors (815 to 817) to the scalar multipliers (812 to 814) which in turn output zero vectors (818 to 820). This causes the adder (821) to output the Register Feedback Vector (807) on signal (822) which is then latched into the register unit at the end of each cycle. Essentially, the arithmetic unit (801) shifts the content of the register unit higher by M symbols in each cycle, until the register unit contains only zero symbols. Meanwhile, M parity symbols contained in the highest M positions in the register unit are read out by the host via the output data signal (823) in each cycle until all n−k parity symbols are read out. At this point, the register unit automatically contains zero symbols only and is thus ready for encoding of the next codeword.

As an alternative, the input reset signal (406 in FIG. 4) may be eliminated. After the Encoder is powered on, the host may clear the register unit by keeping the enable signal unasserted for enough cycles for the entire uninitialized content of the register unit to be shifted out and replaced by zero symbols. From this point on, the register unit content is always all zero after encoding and outputting the parity of each codeword and thus does not need to be explicitly cleared to zero by a reset signal.

The third embodiment provides an Encoder and a Decoder which are an expansion of the Encoder of the second embodiment and the Decoder of the first embodiment, respectively. In the third embodiment, the Encoder and the Decoder may further be configured to process $M_j$ message symbols in cycle j, wherein $M_j$ is a positive integer which is less than or equal to M and may vary from cycle to cycle.

Figure 9:
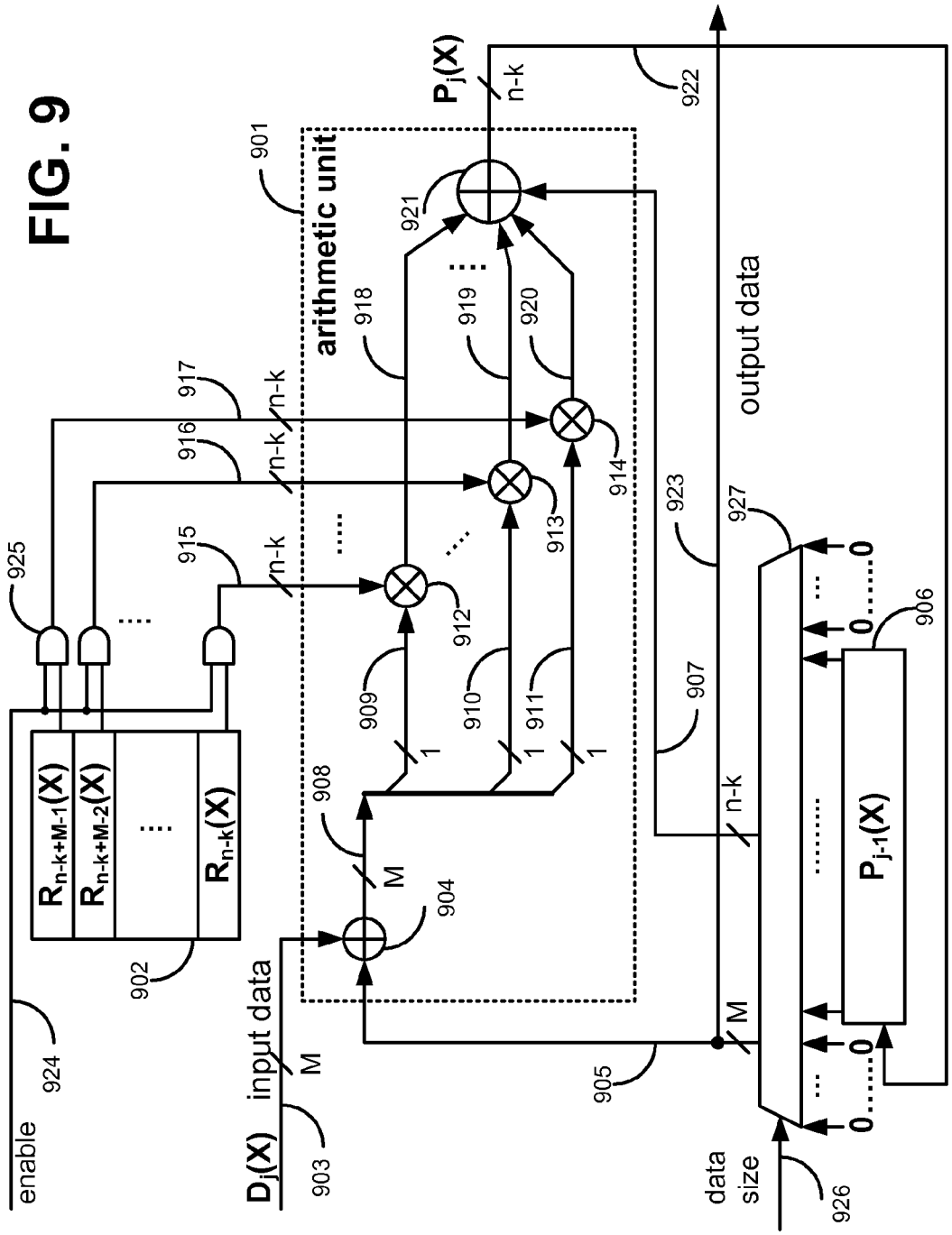
FIG. 9 illustrates an exemplary Encoder of the third embodiment.

The Encoder of the third embodiment is described as follows. As illustrated in FIG. 9, the Encoder is structurally capable of processing M symbols per cycle as in the first embodiment and, in the current embodiment, further comprises an input "data size" signal (926) via which the host system inputs the value of $M_j$, and a multiplexing unit (927) which, with its select input coupled with the input data size signal, takes the n−k symbols in the register unit (906) as input and outputs n−k+M symbols (905, 907). The n−k+M symbols output by the multiplexing unit may be indexed from 0 to n−k+M−1. The highest M output symbols indexed from n−k to n−k+M−1 form the "Register Coefficient Vector" (905), while the lower n−k output symbols indexed from 0 to n−k−1 form the "Register Feedback Vector" (907).

According to the value of $M_j$, which may take on a value between 1 and M, inclusively, the multiplexing unit forms its n−k+M output symbols by placing the n−k symbols of the register unit content in a section of n−k consecutive positions starting from position $M_j$ in the output symbols and by placing zeros in the rest of the output symbols. For example, when $M_j$ has the minimum value of 1, the n−k register unit symbols are placed in output symbols indexed from 1 to n−k with the rest of the output symbols filled with zeros, and when $M_j$ has the value of 2, the n−k register unit symbols are placed in output symbols indexed from 2 to n−k+1 with the rest of the output symbols filled with zeros, and so on. When $M_j$ has the maximum value of M, the n−k register unit symbols are placed in output symbols indexed from M to n−k+M−1 with the rest of the output symbols filled with zeros.

The Encoder described above is capable of receiving a variable number of message symbols in each cycle of the encoding operation and, after the parity has been computed and stored in the register unit, outputting a variable number of parity symbols in each cycle.

During the encoding operation, in cycle 'j', the host keeps the enable signal (924) asserted, inputs the value $M_j$, which is the number of message symbols to be input in cycle j, via the input "data size" signal, and inputs $M_j$ message symbols via the input data signal (903). The $M_j$ message symbols should be placed in the lower $M_j$ positions of the input data signal with the upper (M−$M_j$) positions of the input data signal input with zero symbols. After all message symbols of a codeword have been input, the parity is obtained and contained in the register unit.

Then, the host begins to read parity symbols via the output data signal (923) while keeping the enable signal unasserted and also inputting the value $M_j$, which is the number of parity symbols to be read out in cycle j, via the input "data size" signal. With the enable signal unasserted, the arithmetic unit essentially shifts the register unit content higher by $M_j$ symbols at the end of cycle j. The $M_j$ parity symbols of cycle j appear in the upper $M_j$ positions of the output data signal. The lower (M−$M_j$) symbols of the output parity unit are to be ignored by the host. After all parity symbols have been output, the register unit contains zero symbols only and thus the Encoder is ready for encoding of the next codeword.

Figure 10:
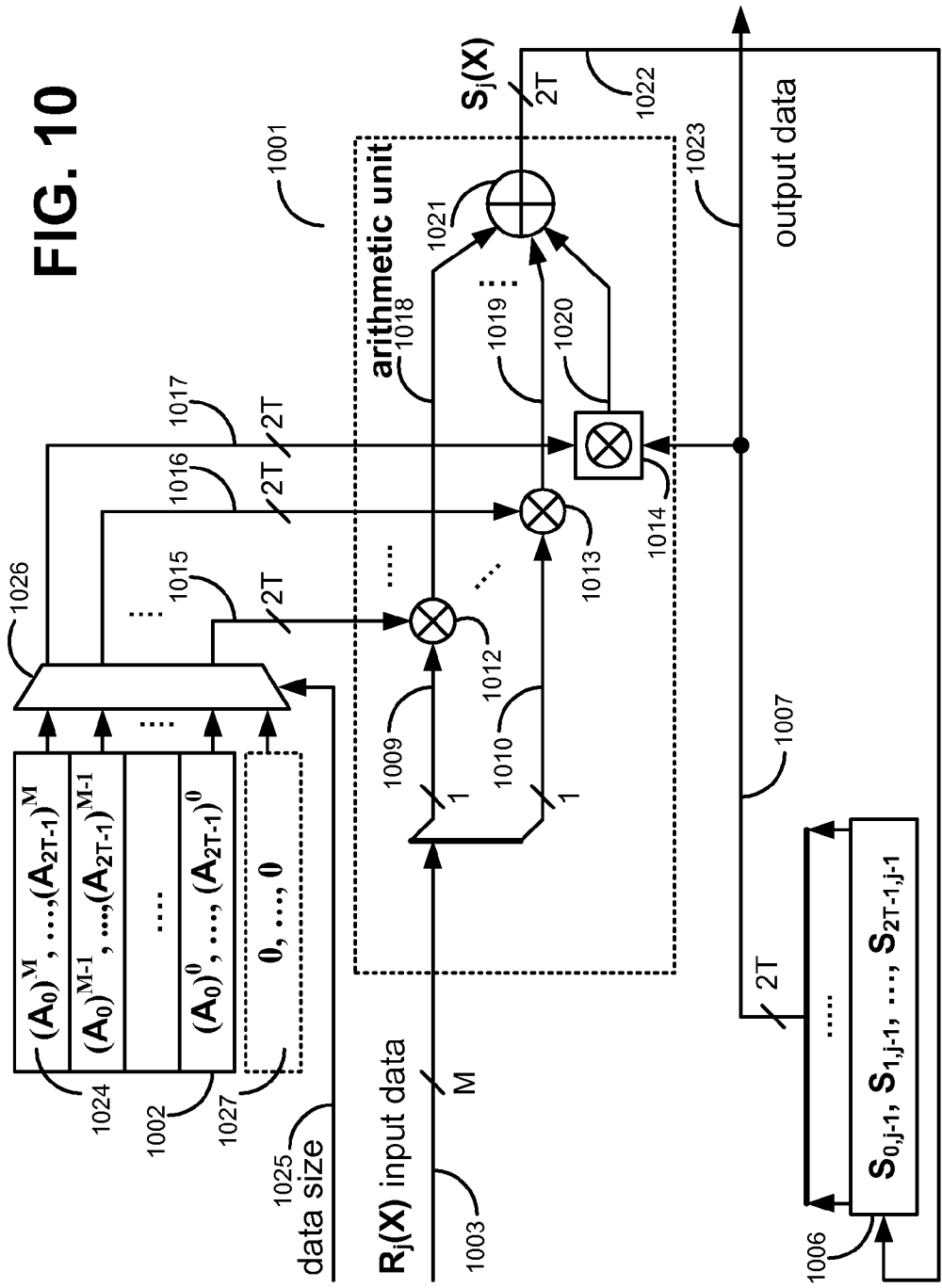
FIG. 10 illustrates an exemplary Decoder of the third embodiment.

The Decoder of the third embodiment is described as follows. As illustrated in FIG. 10, the Decoder comprises an input "data size" signal (1025) via which the host inputs the value of $M_j$ in each cycle of the decoding operation, and a multiplexing unit (1026) which, with its select input coupled with the input data size signal, outputs M+1 vectors (1015 to 1017), whereby $M_j$+1 of these output vectors are selected from the Root Vectors while the other (M−$M_j$) output vectors are zero vectors. The M+1 vectors output by the multiplexing unit may be indexed from 0 to M, whereby the output vectors indexed 0 to M−1 (1015, 1016) are sent to the M scalar multipliers (1012, 1013) to be each multiplied by one of the received symbols (1009, 1010) while the output vector indexed M (1017) is sent to the vector multiplier (1014) to be multiplied symbol-wise with the Register Feedback Vector (1007). For a particular value of $M_j$, the multiplexing unit selects the $M_j$+1 lowest Root Vectors, i.e. Root Vector 0 to Root Vector $M_j$, as the upper $M_j$+1 output vectors, i.e. output vector M−$M_j$ to output vector M, respectively, and the zero vector (1027) as the lower M−$M_j$ output vectors.

In each cycle during the decoding operation, the host inputs $M_j$ symbols of a received codeword to the upper $M_j$ positions of the input data signal (1003) and, at the same time, inputs the value $M_j$ to the input "data size" signal. The lower M−$M_j$ positions of the input data signal have no effect since they are multiplied with zero vectors by the scalar multipliers. After all symbols of the received codeword have been input, the register unit (1006) contains the syndromes of the received codeword and may be read out via the output data signal (1023).

The fourth embodiment provides an Encoder and a Decoder which are an expansion of those of the first embodiment. In the fourth embodiment, the Encoder and the Decoder may further be configured to operate under different cyclic codes. Since a cyclic code is uniquely defined by its generator polynomial g(X), and since the IR Vectors and the Root Vectors are pre-calculated based on the generator polynomial g(X), a different cyclic code corresponds to a different set of IR Vectors and Root Vectors. Therefore, the vector table of the Encoder and Decoder may be configured to output the IR Vectors and Root Vectors, respectively, of different cyclic codes.

Figure 11:
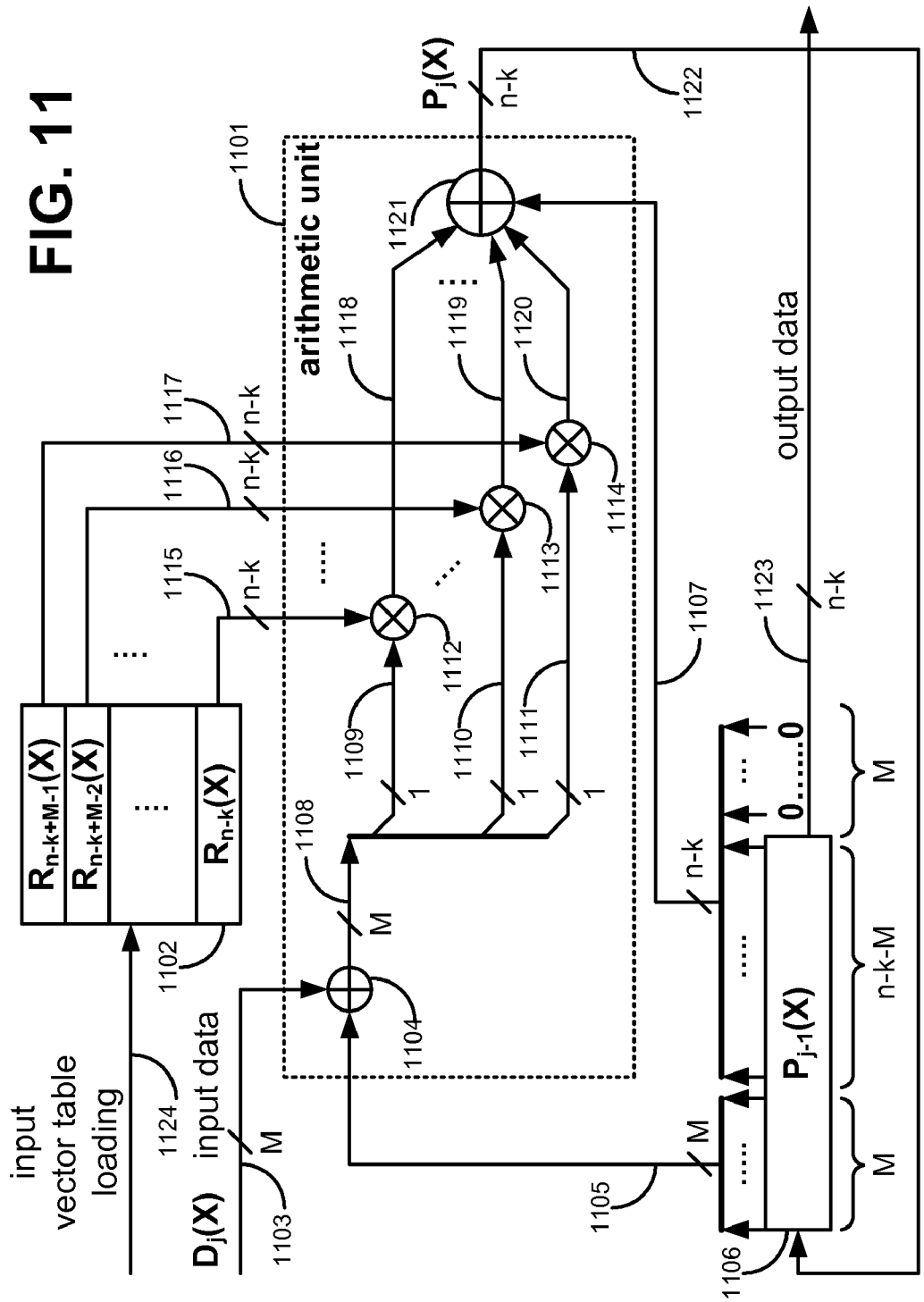
FIG. 11 illustrates an exemplary Encoder of the fourth embodiment.

The Encoder of the fourth embodiment is described as follows. FIG. 11 illustrates an exemplary Encoder, wherein the vector table (1102) is a programmable memory device coupled with an input vector table loading signal (1124) via which the host may load a different set of IR Vectors into the vector table before the encoding operation of a codeword.

Preferably, the cyclic codes for which this Encoder is to be configured have the same symbol size wherein the symbols may be represented by the same Galois Field, such that the Galois Field arithmetic operators such as the scalar multipliers operate correctly for different cyclic codes. Further, the exemplary Encoder illustrated in FIG. 11 has the structural capacity for cyclic codes where the parity of each codeword has the maximum length of n−k symbols. More specifically, the vector table has the capacity of storing M IR Vectors of n−k symbols, each signal (1115 to 1117) carrying an IR Vector is n−k symbols wide; the scalar multipliers (1112 to 1114) each multiplies a symbol (1109 to 1111) with an IR Vector of n−k symbols; the adder (1121) performs addition of M+1 vectors of n−k symbols (1118 to 1120); and the register unit (1106) is capable of storing n−k symbols. Thus, the preferred cyclic codes that this Encoder is to be configured for are (n, h) cyclic codes wherein n−h is less than or equal to n−k.

If n−h is less than n−k, then each IR Vector of n−h symbols is preferably loaded into the upper n−h positions of the vector table entry such that each IR Vector occupies the upper n−h symbols of each of the output signals (1115 to 1117) of the vector table, such that the multiplication performed by the scalar multipliers and the addition performed by the adder (1121) place their results on the upper n−h symbols of the their output signals. Consequently, the valid output (1122) of the arithmetic unit is loaded into the upper n−h positions in the register unit.

Figure 12:
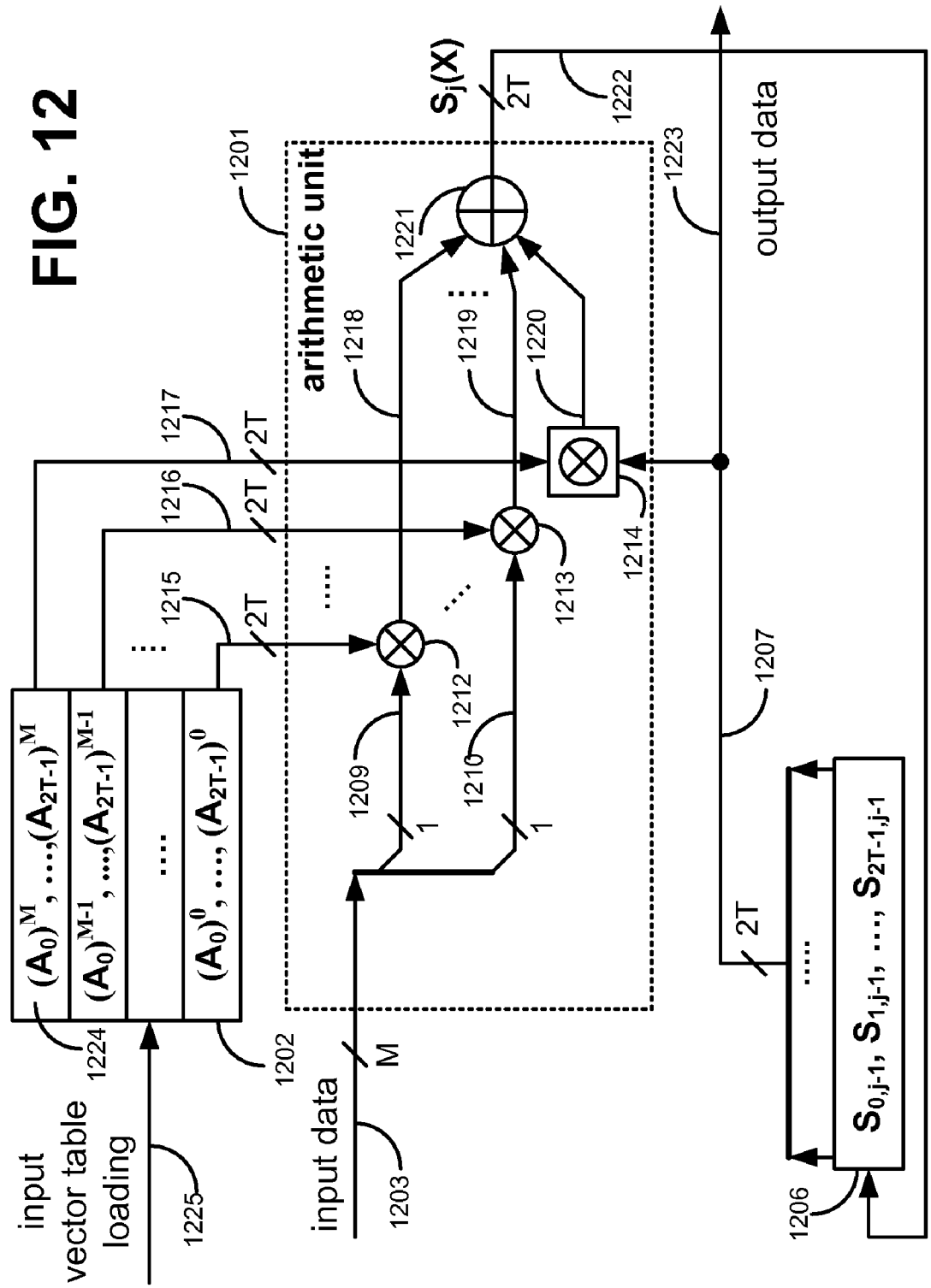
FIG. 12 illustrates an exemplary Decoder of the fourth embodiment.

The Decoder of the fourth embodiment is described as follows. FIG. 12 illustrates an exemplary Decoder, wherein the vector table is a programmable memory device coupled with an input vector table loading signal (1225) via which the host may load a different set of Root Vectors into the vector table before the decoding operation of a received codeword.

Preferably, the cyclic codes for which this Decoder is to be configured are based on generator polynomials having roots of the same Galois Field, such that the Galois Field arithmetic operators such as the scalar multipliers operate correctly for different cyclic codes. Further, the exemplary Decoder illustrated in FIG. 12 has the structural capacity for cyclic codes of generator polynomials having 2T roots. Thus, the preferred cyclic codes for which this Decoder is to be configured are cyclic codes of generator polynomials having fewer than or equal to 2T roots.

In the fifth embodiment, the present invention provides a Hybrid Encoder and Decoder (the Hybrid Device) which can be configured to function either as the Encoder or the Decoder with the majority of its structure shared by the two functions.

Figure 13:
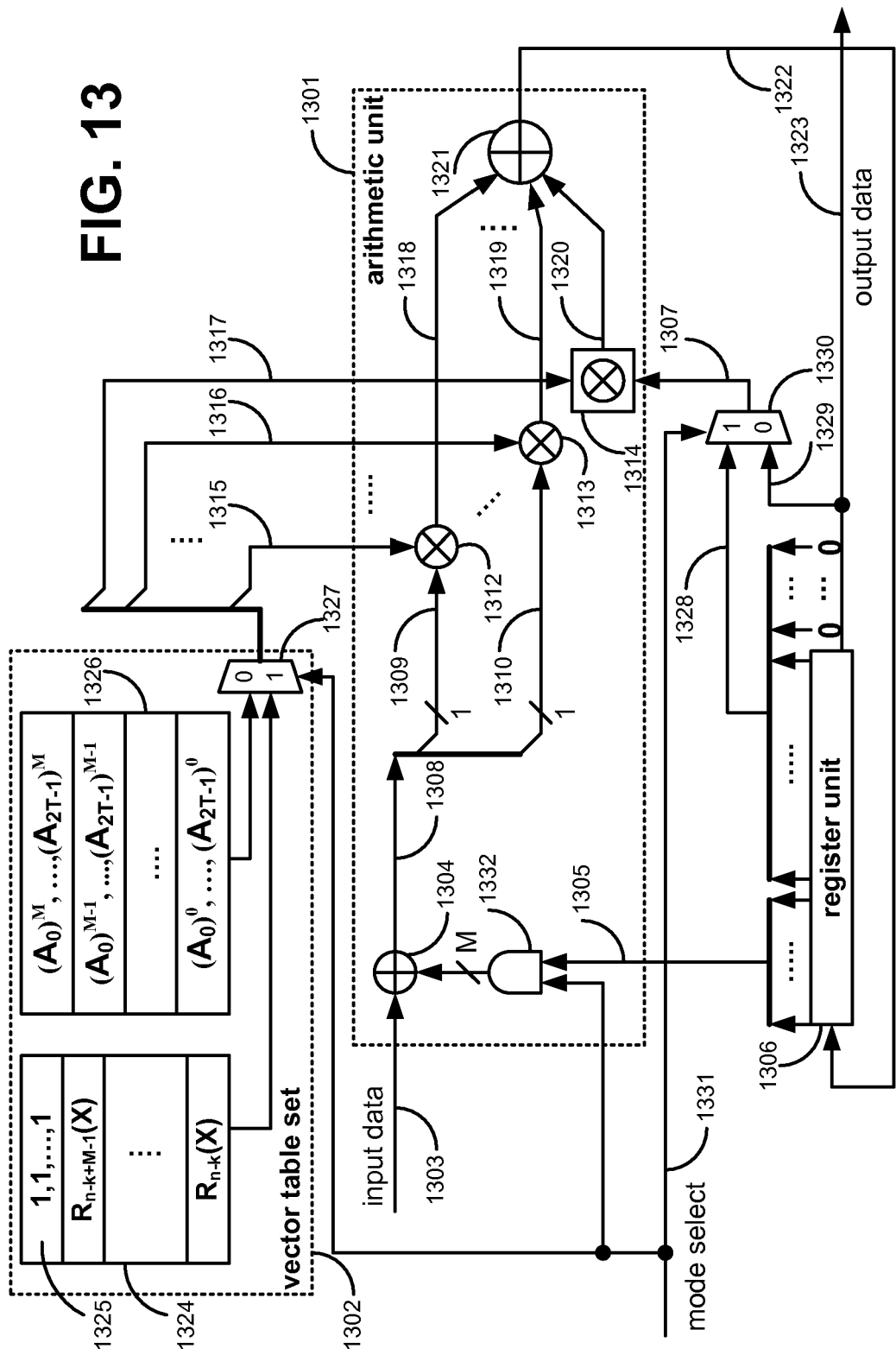
FIG. 13 illustrates an exemplary Hybrid Device of the fifth embodiment.

FIG. 13 illustrates an exemplary Hybrid Device, which is obtained by merging the Encoder and the Decoder of the first embodiment with some components added to provide the configurability between the encoding and the decoding functions. The host configures the Hybrid Device to function as the Encoder or the Decoder by inputting a one or a zero, respectively, via a binary input "mode select" signal (1331). In the encoding and the decoding modes, the host operates the Hybrid Device in the same manner as it does the Encoder and the Decoder, respectively.

The M codeword symbols input via the input data signal (1303) form the Symbol Vector. The vector table in the Encoder and the Decoder is replaced with a vector table set (1302) in the Hybrid Device. The vector table set comprises two vector tables, namely the first vector table (1324) and the second vector table (1326). The first vector table outputs M IR Vectors and the Unit Vector (1325) wherein the IR Vectors are indexed from 0 to M−1 and the Unit Vector is indexed M. The Unit Vector is defined as a vector of symbols all of which have the value of one. The second vector table outputs (M+1) Root Vectors indexed from 0 to M. The vector table set further comprises a multiplexing unit (1327) which has its select input coupled with the input mode select signal (1331) and outputs the (M+1) output vectors of either the first vector table in the encoding mode or the second vector table in the decoding mode. The lower M vectors (1315, 1316) output by the multiplexing unit are sent to the M scalar multipliers (1312, 1313) while the highest vector (1317) output by the vector table set is sent to the vector multiplier (1314). In the encoding mode, the M IR vectors are sent to M scalar multipliers and the Unit Vector is sent to the vector multiplier. In the decoding mode, the lower M Root Vectors are sent to the M scalar multipliers and the highest Root Vector is sent to the vector multiplier.

The arithmetic unit (1301) comprises a two-input adder (1304) and an AND gate (1332). The AND gate, with one of its inputs coupled with the mode select signal (1331) and the other input coupled with the Register Coefficient Vector (1305), either passes the Register Coefficient Vector unaltered in encoding or outputs zero symbols in decoding. The two-input adder performs an addition of the Symbol Vector (1303) and the output vector of the AND gate and outputs the vector sum named the Adder Coefficient Vector (1308). The arithmetic unit further comprises M scalar multipliers (1312, 1313) each of which multiplies a symbol in the Adder Coefficient Vector with one of the lower M vectors (1315, 1316) output by the vector table set, and a vector multiplier (1314) which performs a symbol-wise multiplication of the highest indexed vector (1317) output by the vector table set and the Register Feedback Vector (1307). The arithmetic unit further comprises an (M+1)-input adder (1321) which performs an addition of the output vectors of the M scalar multipliers (1318, 1319) and the vector multiplier (1320), whereby the output vector (1322) of the (M+1)-input adder is the output of the arithmetic unit and is latched into the register unit (1306) at the end of each cycle. The (M+1)-input adder, the scalar multipliers and the vector multiplier, are operators defined by the Galois Field (GF($2^g$)) of which the g(X) roots are elements. The codeword symbols are represented by as elements of GF($2^g$) as inputs to these arithmetic operators. The two-input adder is an operator defined by GF($2^m$).

The register unit (1306) is capable of storing n−k parity symbols for encoding and 2T syndromes for decoding. A multiplexing unit (1330), with its select input coupled with the input mode select signal, outputs the Register Feedback Vector (1307) by selecting either the entire content of the register unit (1329) in decoding, or the lower n−k−M symbols in the register unit shifted higher by M symbols (1328) in encoding. The Register Feedback Vector is sent to the vector multiplier where it is multiplied symbol-wise either with the Root Vector of index M in decoding, or with the Unit Vector in encoding. A symbol-wise multiplication of the Register Feedback Vector (1307) with the Unit Vector is equivalent to multiplying every symbol of the Register Feedback Vector with the value of one, and thus the product of this multiplication is the Register Feedback Vector unaltered.

As discussed previously, the g-bit roots of g(X) represented by GF($2^g$) may have a different size than the m-bit codeword symbols represented by GF($2^m$). For BCH codes, which are a class of the cyclic codes, the GF($2^g$) is an extension field of GF($2^m$), i.e. m is a factor of g, or g=ms. Thus each Root Vector contains 2T elements of ms bits, or a total of 2Tms bits. Each IR Vector contains n−k symbols of m bits, or a total of (n−k)m bits. Since (n−k)≦2Ts for BCH codes, each IR Vector contains at most 2Tms bits. Therefore, the first vector table, the second vector table and the register unit may have the same width of 2Tms bits.

Also with BCH codes, if m=1 (binary BCH codes), then each codeword symbol is 1 bit wide while each root of g(X) is s bits wide. In this case, each scalar multiplier multiplies a 1-bit symbol, represented as an s-bit symbol, with either a Root Vector of 2Ts bits during decoding or an IR Vector of also 2Ts bits in encoding. If m≠1 but s=1 (Reed Solomon Codes), then both the codeword symbol and the root of g(X) are m bits wide. In this case, each scalar multiplier multiplies an m-bit symbol with either a Root Vector of 2Tm bits during decoding or an IR Vector of also 2Tm bits in encoding.

Minor modifications can be made such that the Hybrid Device can be configured for different M values per cycle and/or different cyclic codes per codeword. These modifications are not presented in this embodiment since they have been presented in previous embodiments of both the Encoder and the Decoder, and thus it is obvious to those skilled in the art to incorporate such modifications into the Hybrid Device.

The present invention presented several different embodiments of the Encoder, the Decoder and the Hybrid Device with each embodiment focusing on a particular feature set of the invention. It should be clear to those skilled in the art that each embodiment is not meant to limit the feature set of the invention and that any combination of the feature sets presented in different embodiments may be implemented and would still fall within the scope of this invention.

What is claimed is:

1. An (n, k) cyclic code encoder (the Encoder), comprising:

an input data signal configured to receive M message symbols from an external host per cycle, wherein the M message symbols form the Symbol Vector, wherein M is a positive integer;

a vector table configured to output a set of pre-calculated IR Vectors;

a register unit configured to latch the output vector of a arithmetic unit at the end of each cycle, wherein the register unit content may be cleared to zero by a reset mechanism such as an input reset signal, wherein the upper M symbols in the register unit form the Register Coefficient Vector and the rest of the register unit content shifted higher by M symbols form the Register Feedback Vector;

the arithmetic unit configured to perform an addition of the Symbol Vector and the Register Coefficient Vector in each cycle, wherein the sum of said addition forms the Adder Coefficient Vector, the arithmetic unit further configured to perform a linear combination of the IR Vectors and the Register Feedback Vector in each cycle, wherein, in said linear combination, each IR Vector is multiplied by a coefficient which is a corresponding symbol in the Adder Coefficient Vector and the Register Feedback Vector is multiplied by a coefficient equal to one, wherein the sum of said linear combination is the output vector of the arithmetic unit; and an output data signal configured to output the content of the register unit as the output of the Encoder.

2. The Encoder as defined in claim 1, wherein the arithmetic unit comprises a two-input adder which performs an addition of the Symbol Vector and the Register Coefficient Vector and outputs the Adder Coefficient Vector, wherein the arithmetic unit further comprises M scalar-vector multipliers, each of which multiplies an IR Vector with a corresponding symbol in the Adder Coefficient Vector, wherein the arithmetic unit further comprises an (M+1)-input adder which performs an addition of the M output vectors of the M scalar-vector multipliers and the Register Feedback Vector and outputs a vector sum which is the output vector of the arithmetic unit.

3. The method for an external host to operate the Encoder as defined in claim 1, the method comprising:
    activating the reset mechanism to clear the register unit;
    inputting M message symbols of a codeword per cycle to the input data signal until all message symbols of the codeword have been input; and
    reading the parity symbols of the codeword from the output data signal.

4. The Encoder as defined in claim 1, further comprising:
    an input data size signal configured for an external host to provide in each cycle the value of S which indicates the number of message symbols input to the input data signal in the same cycle, wherein S is less than or equal to M and may vary from cycle to cycle; and
    a multiplexing unit configured by the input data size signal to form the Register Coefficient Vector and the Register Feedback Vector by using the symbols in the register unit and zero symbols, wherein the multiplexing unit forms the Register Coefficient Vector of M symbols by placing the upper S symbols in the register unit and (M−S) zero symbols on the lower S and the upper (M−S) positions in the Register Coefficient Vector, respectively, wherein the multiplexing unit forms the Register Feedback Vector of (n−k) symbols by placing the lower (n−k−S) symbols in the register unit and S zero symbols on the upper (n−k−S) and the lower S positions in the Register Feedback Vector, respectively.

5. The method for an external host to operate the Encoder as defined in claim 4, the method comprising:
    activating the reset mechanism to clear the register unit;
    in each cycle, inputting S message symbols of a codeword and (M−S) zero symbols to the lower S and the upper (M−S) positions of the input data signal, respectively, and the value S to the input data size signal, until all message symbols of the codeword have been input; and
    reading the parity symbols of the codeword from the output data signal.

6. The Encoder as defined in claim 1, further comprising an input vector table loading signal coupled with the vector table, wherein an external host may load a different set of IR Vectors into the vector table via the input vector table loading signal prior to the encoding of a codeword.

7. An (n, k) cyclic code syndrome computer (the Decoder), comprising:
    an input data signal configured to receive M symbols from an external host per cycle, wherein M is a positive integer;
    a vector table configured to output (M+1) Root Vectors;
    a register unit configured to latch the output vector of a arithmetic unit at the end of each cycle, wherein the register unit content may be cleared to zero by a reset mechanism such as an input reset signal, wherein the content of the register unit forms the Register Feedback Vector;
    the arithmetic unit configured to perform a scalar-vector multiplication of each of the lower M Root Vectors with a corresponding received symbol, the arithmetic unit further configured to perform a vector-vector multiplication of the highest Root Vector with the Register Feedback Vector, the arithmetic unit further configured to perform an addition of the products of the M scalar-vector multiplications and the product of the vector-vector multiplication, wherein the vector sum of the addition is the output vector of the arithmetic unit; and
    an output data signal configured to output the content of the register unit as the output of the Decoder.

8. The method for an external host to operate the Decoder as defined in claim 7, the method comprising:
    activating the reset mechanism to clear the register unit;
    inputting M symbols of a received codeword per cycle to the input data signal until all symbols of the received codeword have been input; and
    reading syndromes of the received codeword from the output data signal.

9. The Decoder as defined in claim 7, further comprising:
    an input data size signal configured for an external host to provide in each cycle the value of S which indicates the number of received codeword symbols input to the input data signal in the same cycle, wherein S is less than or equal to M and may vary from cycle to cycle; and
    a multiplexing unit configured by the input data size signal to output (M+1) vectors selected from the Root Vectors and zero vectors, wherein the multiplexing unit selects the lower (S+1) Root Vectors and (M−S) zero vectors as the upper (S+1) and lower (M−S) output vectors, respectively.

10. The method for an external host to operate the Decoder as defined in claim 9, the method comprising:
    activating the reset mechanism to clear the register unit;
    in each cycle, inputting S symbols of a received codeword to the upper S positions of the input data signal and the value S to the input data size signal, until all symbols of the received codeword have been input; and
    reading syndromes of the received codeword from the output data signal.

11. The Decoder as defined in claim 7, further comprising an input vector table loading signal coupled with the vector table, wherein an external host may load a different set of Root Vectors into the vector table via the input vector table loading signal prior to the syndrome computation of a received codeword to configure the Decoder to operate under a different cyclic code.

12. An (n, k) cyclic code hybrid encoder and syndrome computer (the Hybrid Device), comprising:
    an input mode select signal for an external host to configure the Hybrid Device to operate in either the encoding mode or the decoding mode;

an input data signal configured to receive M symbols from an external host per cycle, wherein the M symbols form the Symbol Vector, wherein M is a positive integer;

a vector table set configured to output either a set of IR Vectors and a Unit Vector in the encoding mode or a set of Root Vectors in the decoding mode;

a register unit configured to latch the output vector of a arithmetic unit at the end of each cycle, wherein the register unit content may be cleared to zero by a reset mechanism such as an input reset signal, wherein the Register Coefficient Vector is formed by the upper M symbols in the register unit, wherein the Register Feedback Vector is formed by either the lower (n−k−M) symbols in the register unit shifted higher by M symbols in the encoding mode or the entire register unit content in the decoding mode;

the arithmetic unit configured to perform in each cycle an addition of the Symbol Vector and either the Register Coefficient Vector in the encoding mode or a zero vector in the decoding mode, wherein the vector sum of said addition is the Adder Coefficient Vector, the arithmetic unit further configured to perform in each cycle a scalar-vector multiplication of each of the lower M vectors output by the vector table set and a corresponding symbol in the Adder Coefficient Vector, the arithmetic unit further configured to perform a vector-vector multiplication of the highest vector output by the vector table set and the Register Feedback Vector, the arithmetic unit further configured to perform an addition of the products of the M scalar-vector multiplications and the product of the vector-vector multiplication, wherein the vector sum of the addition is the output vector of the arithmetic unit; and an output data signal configured to output the content of the register unit as the output of the Hybrid Device.

13. The Hybrid Device as defined in claim 12, wherein the vector table set comprises two vector tables, the first vector table outputting M IR Vectors and a Unit Vector, the second vector table outputting (M+1) Root Vectors, wherein the vector table set further comprises a multiplexing unit having its select input coupled with the input mode select signal and outputting either the output vectors of the first vector table in the encoding mode or the output vectors of the second vector table in the decoding mode, wherein the output of the multiplexing unit is the output of the vector table set.

14. The Hybrid Device as defined in claim 12, further comprising a multiplexing unit having its select input coupled with the input mode select signal and outputting either a vector formed by the lower (n−k−M) symbols in the register unit shifted higher by M symbols in the encoding mode or a vector formed by the register unit content in the decoding mode, wherein the output of the multiplexing unit is the Register Feedback Vector.

15. The Hybrid Device as defined in claim 12, wherein the arithmetic unit comprises a gating unit responsive to the input mode select signal, wherein the gating unit either passes the Register Coefficient Vector unaltered in the encoding mode or outputs a zero vector in the decoding mode, wherein the arithmetic unit further comprises a two-input adder which performs an addition of the Symbol Vector and the output vector of said gating unit and outputs the Adder Coefficient Vector, wherein the arithmetic unit further comprises M scalar-vector multipliers each of which multiplies one of the lower M output vectors of the vector table set with a corresponding symbol in the Adder Coefficient Vector, wherein the arithmetic unit further comprises a vector-vector multiplier which performs a symbol-wise multiplication of the highest output vector of the vector table set with the Register Feedback Vector, wherein the arithmetic unit further comprises an (M+1)-input adder which performs an addition of the output vectors of the M scalar-vector multipliers and the vector-vector multiplier, wherein the vector sum of said addition is the output vector of the arithmetic unit.

16. The method for en external host to operate the Hybrid Device as defined in claim 12 in the encoding mode, the method comprising:

activating the reset mechanism to clear the register unit;

configuring the Hybrid Device into the encoding mode by asserting the corresponding value to the input mode select signal;

inputting M message symbols of a codeword per cycle to the input data signal until all message symbols of the codeword have been input; and reading parity symbols of the codeword from the output data signal.

17. The method for an external host to operate the Hybrid Device as defined in claim 12 in the decoding mode, the method comprising:

activating the reset mechanism to clear the register unit;

configuring the Hybrid Device into the decoding mode by asserting the corresponding value to the input mode select signal;

inputting M symbols of a received codeword per cycle to the input data signal until all symbols of the received codeword have been input, wherein the received codeword symbols are potentially corrupted by errors; and reading syndromes of the received codeword from the output data signal.

* * * * *